US012724349B2

(12) United States Patent
Zhang et al.

(10) Patent No.: US 12,724,349 B2
(45) Date of Patent: Sep. 1, 2026

(54) METHOD FOR FORMING A MONODISPERSE GRANULAR FILM

(71) Applicants: ZHEJIANG JINKO SOLAR CO., LTD., Haining (CN); JINKO SOLAR CO., LTD., Jiangxi (CN)

(72) Inventors: Yuanfang Zhang, Haining (CN); Menglei Xu, Haining (CN); Jie Yang, Haining (CN); Xinyu Zhang, Haining (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 103 days.

(21) Appl. No.: 18/415,538

(22) Filed: Jan. 17, 2024

(65) Prior Publication Data

US 2024/0192603 A1 Jun. 13, 2024

Related U.S. Application Data

(63) Continuation of application No. PCT/CN2023/090121, filed on Apr. 23, 2023.

(30) Foreign Application Priority Data

Dec. 13, 2022 (CN) ......................... 202211601619.9
Mar. 9, 2023 (CN) ......................... 202310243004.1

(51) Int. Cl.
*G03F 7/36* (2006.01)
*G03F 7/38* (2006.01)
(Continued)

(52) U.S. Cl.
CPC .................. *G03F 7/36* (2013.01); *G03F 7/38* (2013.01); *H10F 10/16* (2025.01); *H10F 71/00* (2025.01)

(58) Field of Classification Search
CPC ... G03F 7/36; G03F 7/38; H10F 10/16; H10F 71/00
See application file for complete search history.

(56) References Cited

U.S. PATENT DOCUMENTS 3,480,818 A 11/1969 Te Velde
3,522,339 A * 7/1970 Te Velde ................ H05B 33/20 148/DIG. 120

(Continued)

FOREIGN PATENT DOCUMENTS

CN 1115485 A 1/1996
CN 102177592 A 9/2011

(Continued)

OTHER PUBLICATIONS

Bodnar, Eszter, et al., "Growth dynamics of granular films produced by electrospray". Journal of Colloid and Interface Science 407 (2013) 536-545.*

(Continued)

*Primary Examiner* — Bret P Chen
(74) *Attorney, Agent, or Firm* — USCH Law, PC

(57) ABSTRACT

The method for forming the monodisperse granular film includes: providing an initial substrate having a first surface and a second surface opposite to the first surface, forming a sacrificial layer, an adhesive layer and a monodisperse granular layer over the first surface, where the monodisperse granular layer includes multiple granules arranged dispersedly over the first surface, the sacrificial layer is between the multiple granules and the initial substrate, the adhesive layer is between adjacent granules of the multiple granules, and the adhesive layer is exposed between adjacent granules on a side of the multiple granules away from the initial substrate, dissolving and removing the initial substrate, and dissolving and removing the sacrificial layer. The embodiments of the present application are at least conducive to (Continued)

reducing the difficulty in forming the monodisperse granular film, and extending application scenarios of the stacked solar cell.

14 Claims, 6 Drawing Sheets

(51) Int. Cl.
*H10F 10/16* (2025.01)
*H10F 71/00* (2025.01)

(56) References Cited

U.S. PATENT DOCUMENTS

| | | | | |
|---|---|---|---|---|
| 6,042,894 | A | 3/2000 | Goto et al. | |
| 6,927,240 | B2 * | 8/2005 | Schmid | A61K 8/02 264/9 |
| 2005/0009079 | A1 * | 1/2005 | Anders | G11B 5/658 435/7.1 |
| 2010/0086799 | A1 | 4/2010 | Asai et al. | |
| 2011/0232760 | A1 | 9/2011 | Shirata | |
| 2011/0309236 | A1 * | 12/2011 | Tian | H10F 30/288 257/E31.097 |
| 2015/0104565 | A1 | 4/2015 | Chen et al. | |
| 2022/0281214 | A1 | 9/2022 | Huang et al. | |

FOREIGN PATENT DOCUMENTS

| | | | | |
|---|---|---|---|---|
| CN | 103052689 | A | 4/2013 | |
| CN | 103298496 | A | 9/2013 | |
| CN | 105742402 | A | 7/2016 | |
| CN | 107076864 | A | 8/2017 | |
| CN | 107123697 | A | 9/2017 | |
| CN | 109285946 | A | 1/2019 | |
| CN | 109545973 | A | 3/2019 | |
| CN | 109817812 | A | 5/2019 | |
| CN | 110120438 | A | 8/2019 | |
| CN | 107020854 | B * | 9/2019 | B41M 5/025 |
| CN | 110444669 | A | 11/2019 | |
| CN | 111370520 | A | 7/2020 | |
| CN | 111816772 | A | 10/2020 | |
| CN | 111816773 | A | 10/2020 | |
| CN | 109817812 | B | 11/2020 | |
| CN | 112574438 | B | 5/2021 | |
| CN | 113314672 | A | 8/2021 | |
| CN | 113611762 | A | 11/2021 | |
| CN | 108899420 | B | 3/2022 | |
| CN | 113604867 | B | 4/2022 | |
| CN | 114335216 | A | 4/2022 | |
| CN | 114864377 | A | 8/2022 | |
| CN | 115668460 | A | 1/2023 | |
| CN | 115732581 | A | 3/2023 | |
| CN | 115939263 | A | 4/2023 | |
| DE | 102018214017 | B4 * | 8/2022 | B81C 1/00 |
| GB | 1503512 | A | 3/1978 | |
| JP | 2002023298 | A | 1/2002 | |
| JP | 2012097215 | A | 5/2012 | |
| KR | 20220086304 | A | 6/2022 | |

OTHER PUBLICATIONS

Zamankhan, Piroz, “Bubbling in vibrated granular films”. Physical Review E 83, 021306 (2011) pp. 1-16.*

Bazargan, Samad, et al., “Controlled Growth of Monodisperse Nanocrystallites in Tin(IV) Oxide Nanofilms”. Crystal Growth & Design, vol. 11, No. 1, 2011, pp. 247-255.*

Cabrera, Miguel Angel, et al., “Monodisperse granular flows in viscous dispersions in a centrifugal acceleration field”. Geophysical Research Abstracts vol. 18, EGU2016-16139, 2016, one page. Abstract Only.*

Yang, Rongwei, et al., “Prediction of permeability of monodisperse granular materials with a micromechanics approach”. Journal of Applied Geophysics 127 (2016) 82-90.*

Micky, Simon, et al., “Multilayer Langmuir Film of Monodisperse Au Nanoclusters: Unusual Growth via Bilayers”. Langmuir, 2022, 38, 14850-14856.*

Homaeigohar, Shahin, et al., “Size-tailored physicochemical properties of Monodisperse polystyrene nanoparticles and the nanocomposites Made thereof”. Scientific Reports (2020) 10:5191, pp. 1-11.*

Hemmerle, Arnaud, et al., “A cohesive granular material with tunable elasticity”. Scientific Reports (2016) 6:35650, pp. 1-11.*

Zhejiang Jinko Solar Co., Ltd. et al., EP Search Report, EP23841173.0, Feb. 14, 2025, 12 pgs.

Zhejiang Jinko Solar Co., Ltd., CN First Office Action with English translation, CN 2023102430041, Apr. 18, 2023, 15 pgs.

Zhejiang Jinko Solar Co., Ltd., CN Second Office Action with English translation, CN 2023102430041, May 12, 2023, 12 pgs.

Boyun Huang, et al., “New solar materials/China’s strategic emerging industries/new materials”, Chinese Materials Research Society, Dec. 31, 2017, 7 pgs.

Zhejiang Jinko Solar Co., Ltd. et al., Extended European Search Report, EP 22957622.8, Oct. 4, 2024, 5 pgs.

Zhejiang Jinko Solar Co., Ltd. et al., Extended European Search Report, EP 22957615.2, Nov. 14, 2024, 7 pgs.

Lung-Chien Chen et al., “Influence of PMMA on All-Inorganic Halide Perovskite CsPbBr3 Quantum Dots Combined with Polymer Matrix”, Materials, vol. 12, No. 6, Mar. 25, 2019, 9 pgs.

Xiong Li et al., “Improved performance and stability of perovskite solar cells by crystal crosslinking with alkylphosphonic acid [omega]-ammonium chlorides”, Nature Chemistry, vol. 7, No. 9, Aug. 17, 2015, 9 pgs.

Wentao Fan et al., “NH3+-Functionalized PAMAM Dendrimers Enhancing Power Convension Efficiency and Stability of Perovskite Solar Cells”, Journal of Electronic Materials, Springer US, New York, vol. 50, No. 11, Sep. 3, 2021, 12 pgs.

* cited by examiner

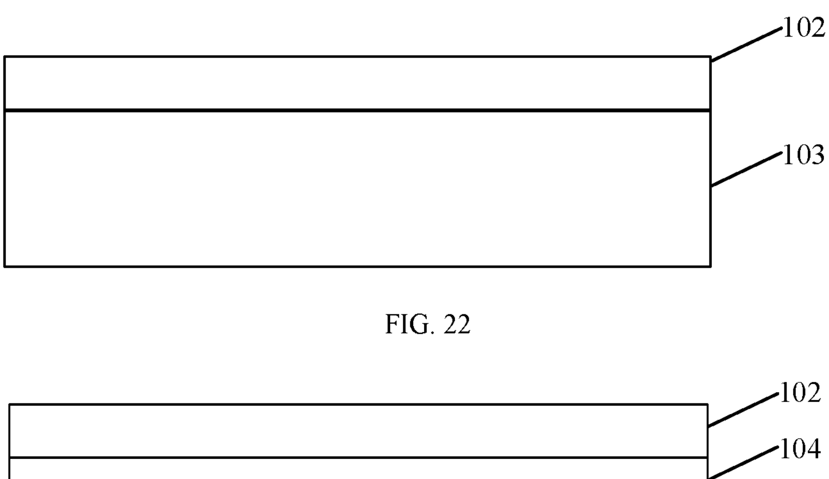
FIG. 22
FIG. 23
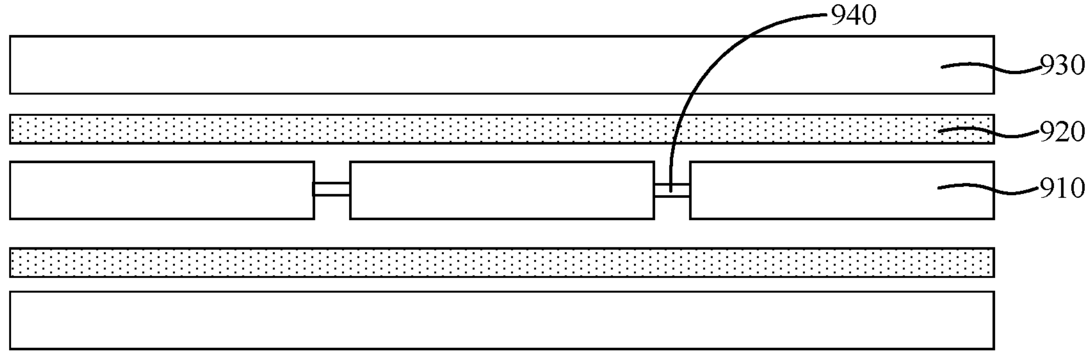
FIG. 24

METHOD FOR FORMING A MONODISPERSE GRANULAR FILM

CROSS-REFERENCE TO RELATED APPLICATION

The present application is a continuation of PCT Patent Application No. PCT/CN2023/090121, entitled "MONODISPERSE GRANULAR FILM, METHOD FOR FORMING THE MONODISPERSE GRANULAR FILM, SOLAR CELL, METHOD FOR PREPARING THE SOLAR CELL, AND PHOTOVOLTAIC MODULE," filed Apr. 23, 2023, which claims priority to Chinese patent application No. 202211601619.9, entitled "MONODISPERSE PARTICLE FILM, FORMING METHOD THEREOF AND PHOTOVOLTAIC CELL," filed Dec. 13, 2022, and Chinese patent application No. 202310243004.1, entitled "SOLAR CELL PREPARATION METHOD, SOLAR CELL AND PHOTOVOLTAIC MODULE," filed Mar. 9, 2023, each of which is incorporated by reference herein in its entirety.

TECHNICAL FIELD

Embodiments of the present application relate to the technical field of electronic materials, and in particular to a monodisperse granular film, a method for forming the monodisperse granular film, a solar cell, a method for preparing the solar cell, and a photovoltaic module.

BACKGROUND

A monodisperse granular film is a film layer embedded with a single layer of granules, fine granules, or particles. The granules in the monodisperse granular film are generally fixed by an adhesive layer, where a thickness of the adhesive layer is the same as the diameter of the granules, or the thickness of the adhesive layer is smaller than the diameter of the granules embedded in it. In response to the granules in monodisperse granular film being granules with photoelectric conversion capability or luminescent property, the monodisperse granular film can be applied to the field of photoelectric conversion due to its low temperature synthesis and excellent performance. However, it is difficult to prepare a monodisperse granular film with excellent performance and high integrity at present.

In addition, an important factor affecting the proportion of solar energy in energy utilization is the photoelectric conversion efficiency of a solar cell. In order to improve the photoelectric conversion efficiency of the solar cell, forming a double-sided stacked solar cell composed of a bottom cell and a top cell is currently highly regarded.

However, at present, a stacked solar cell including the monodisperse granular films has limitations in application scenarios and photoelectric conversion efficiency.

SUMMARY

The embodiments of the present application provide a monodisperse granular film, a method for forming the same, a method for forming the monodisperse granular film, a solar cell, a method for preparing the solar cell, and a photovoltaic module, which are at least conducive to reducing the difficulty in forming the monodisperse granular film, and improving the photoelectric conversion efficiency of the solar cell.

According to some embodiments of the present application, an aspect of the embodiments of the present application provides a method for forming a monodisperse granular film, the method includes: providing an initial substrate having a first surface; forming a sacrificial layer, an adhesive layer and a monodisperse granular layer over the first surface. The monodisperse granular layer includes multiple granules arranged dispersedly over the first surface, the sacrificial layer is between the multiple granules and the initial substrate, portions of the adhesive layer are between adjacent granules of the multiple granules, and the adhesive layer is exposed between adjacent granules on a side of the multiple granules away from the initial substrate. The method further includes removing the initial substrate by dissolving the initial substrate, and removing the sacrificial layer by dissolving the sacrificial layer.

In some embodiments, the initial substrate includes molten salt or polyvinyl alcohol.

In some embodiments, forming the sacrificial layer, the adhesive layer and the monodisperse granular layer over the first surface includes: forming an initial adhesive layer and the monodisperse granular layer over the first surface. First portions of the initial adhesive layer are between the multiple granules and the initial substrate and second portions of the initial adhesive layer are between adjacent granules of the multiple granules, and the second portions of the initial adhesive layer are exposed between adjacent granules on the side of the multiple granules away from the initial substrate. The operation further includes curing the second portions of the initial adhesive layer to form the adhesive layer.

In some embodiments, the initial adhesive layer includes negative photoresist, and curing the part of the initial adhesive layer between adjacent granules of the multiple granules to form the adhesive layer includes: performing exposure processing on a side of the initial adhesive layer away from the initial substrate, where the part of the initial adhesive layer between adjacent granules of the multiple granules is cured to form the adhesive layer by the exposure processing.

In some embodiments, forming the sacrificial layer, the adhesive layer and the monodisperse granular layer over the first surface includes: forming the sacrificial layer and the monodisperse granular layer over the first surface, where the sacrificial layer is between the multiple granules and the initial substrate; forming an initial adhesive layer, where first portions of the initial adhesive layer are between the multiple granules and the initial substrate and second portions of the initial adhesive layer are between adjacent granules of the multiple granules. The operation further includes curing the second portions of the initial adhesive layer to form the adhesive layer and removing the second portions of the initial adhesive layer on the side of the multiple granules away from the initial substrate by dissolving the second portions of the initial adhesive layer.

In some embodiments, the initial adhesive layer includes negative photoresist, and curing the second portions of the initial adhesive layer to form the adhesive layer includes: performing exposure processing on a side of the initial adhesive layer away from the initial substrate, where the second portions of the initial adhesive layer is cured to form the adhesive layer by exposure processing.

In some embodiments, the sacrificial layer includes thermoplastic polymer.

In some embodiments, before removing the second portions of the initial adhesive layer, the method further includes: forming a first functional layer between adjacent granules on a side of the multiple granules away from the initial substrate, and on a surface of the adhesive layer away from the initial substrate.

In some embodiments, after the first functional layer is formed, the method further includes: forming a substrate over a surface of the first functional layer away from the multiple granules.

In some embodiments, after the sacrificial layer is removed, and the method further includes: forming a second functional layer between adjacent granules on a side of the multiple granules away from the first functional layer, and on a surface of the adhesive layer away from the first functional layer.

In some embodiments, a maximum distance between any two points on an outer surface of each of the multiple granules ranges from 5 μm to 100 μm.

In some embodiments, a ratio of an area of an orthographic projection of each of the multiple granules over the first surface to an area of the first surface ranges from 30% to 90%.

In some embodiments, the multiple granules include at least one of semiconductor granules or ion transport granules.

In some embodiments, the multiple granules include perovskite granules.

According to some embodiments of the present application, another aspect of the embodiments of the present application further provides a monodisperse granular film. The monodisperse granular film is prepared by the method for forming a monodisperse granular film according to any one above, and the monodisperse granular film includes: a monodisperse granular layer, where the monodisperse granular layer has a first side and a second side opposite to the first side, the monodisperse granular layer includes multiple granules arranged in a direction perpendicular to the first side and pointing to the second side; and an adhesive layer between adjacent granules of the multiple granules.

In some embodiments, the monodisperse granular film further includes: a first functional layer between adjacent granules on a side of the multiple granules away from the second side, and on a surface of the adhesive layer away from the second side.

In some embodiments, the monodisperse granular film further includes a substrate, which is over the surface of the first functional layer away from granules.

In some embodiments, the monodisperse granular film further includes a second functional layer, the second functional layer is between adjacent granules on a side of the multiple granules away from the first surface, and the surface far away from the first surface of the adhesive layer.

According to some embodiments of the present application, still another aspect of the embodiments of the present application further provides a solar cell including the monodisperse granular film, and a method for preparing the solar cell. The method includes: providing a substrate, where the substrate is a molten salt substrate, and a melting point of the molten salt substrate is defined as a first temperature. The method further includes forming a thin film solar cell on a surface of the substrate, where the thin film solar cell includes an absorption layer formed at a second temperature, and the first temperature is greater than the second temperature. The method further includes providing a bottom cell, and attaching the bottom cell to a surface of the thin film solar cell away from the substrate. The method further includes removing the substrate to expose the surface of the thin film solar cell away from the substrate. The method further includes forming a transparent electrode layer on the surface of the thin film solar cell away from the bottom cell and forming grid lines on a surface of the transparent electrode layer away from the thin film solar cell.

In some embodiments, a difference between the first temperature and the second temperature is not less than 100 degrees Celsius.

In some embodiments, the second temperature ranges from 300 degrees Celsius to 1000 degrees Celsius.

In some embodiments, attaching the bottom cell to the surface of the thin film solar cell away from the substrate includes: forming a bonding layer between the bottom cell and the thin film solar cell, where two opposite surfaces of the bonding layer are adhered to the surface of the thin film solar cell away from the substrate and the bottom cell, respectively.

In some embodiments, forming the bonding layer between the bottom cell and the thin film solar cell includes: forming the bonding layer on a surface of the bottom cell; attaching the surface of the thin film solar cell away from the substrate to the bonding layer. Alternatively, forming the bonding layer between the bottom cell and the thin film solar cell includes forming the bonding layer on the surface of the thin film solar cell away from the substrate, and attaching the bottom cell to the bonding layer.

In some embodiments, before forming the thin film solar cell, the method further includes: forming a barrier layer on the surface of the substrate, where forming the thin film solar cell includes forming the thin film solar cell on a surface of the barrier layer away from the substrate. After the substrate is removed, the method further includes removing the barrier layer.

In some embodiments, the barrier layer has a thickness of 1 nm to 100 nm.

In some embodiments, materials of the barrier layer include titanium nitride, aluminum oxide, or molybdenum oxide.

In some embodiments, materials of the substrate include sodium chloride, potassium iodide, ammonium chloride, or potassium hydroxide.

In some embodiments, a thermal expansion coefficient of the substrate is less than or equal to $5\times10^{-5}$/K.

In some embodiments, removing the substrate includes dissolving the substrate with a washing solution to remove the substrate.

In some embodiments, the washing solution includes water or methanol.

Correspondingly, the embodiments of the present application further provide a solar cell. The solar cell is formed by the method for preparing a solar cell according to any one above, and the solar cell includes a thin film solar cell and a bottom cell arranged in sequence.

In some embodiments, the solar cell further includes a bonding layer. Two opposite surfaces of the bonding layer are adhered to the surface of the thin film solar cell away from the substrate and the bottom cell, respectively.

In some embodiments, the bonding layer is a conductive glue.

In some embodiments, the thin film solar cell includes a copper indium gallium selenium (CIGS) thin film solar cell, a cadmium telluride thin film solar cell, or a III-V family thin film solar cell.

Correspondingly, the embodiments of the present application further provide a photovoltaic module. The photovoltaic module includes a cell string, where the cell string is formed by connecting multiple solar cells, each of the multiple solar cells is a solar cell according to any one above. The photovoltaic module further includes a package layer configured to cover a surface of the cell string, and a cover plate configured to cover a surface of the package layer away from the cell string.

The technical solutions provided according to the embodiments of the present application have at least the following advantages. In the method for forming a monodisperse granular film, the initial substrate configured to bear the monodisperse granular layer is first provided, and the sacrificial layer, the adhesive layer and the monodisperse granular layer are formed on the initial substrate. The adhesive layer is between adjacent granules of the monodisperse granular layer, and is configured to bond and fix the multiple granules arranged dispersedly. The sacrificial layer is between the initial substrate and the multiple granules, and is configured to temporarily cover a lower surface of each of the multiple granules, so that in the monodisperse granular film obtained by subsequently removing the sacrificial layer, the adhesive layer is exposed between adjacent granules on a side of the multiple granules away from the initial substrate. In addition, the initial substrate configured to temporarily bear the multiple granules is a soluble substrate. Therefore, compared with the initial substrate made of glass, plastic foil, metal foil and other non-soluble materials, and the use of the method of tearing off the substrate, the embodiments of the present application provide a method in which the initial substrate can be removed by dissolution, which can easily remove the initial substrate, and the success rate of removing the initial substrate is high. In addition, the process of removing the initial substrate causes less damage to the monodisperse granular film, which is conducive to reducing the difficulty in forming the monodisperse granular film with excellent performance and high integrity.

In the technical solution for preparing a solar cell provided according to the embodiments of the present application, a molten salt substrate with a melting point of first temperature is first provided as the substrate, and then a thin film solar cell is formed on the surface of the substrate. The absorption layer of the thin film solar cell is formed at a second temperature, and the second temperature is lower than the first temperature. After the thin film solar cell is prepared on the surface of the molten salt substrate, the bottom cell is provided and attached to the thin film solar cell. After that, the substrate is removed and a transparent electrode layer is formed on the surface of the thin film solar cell, and grid lines are formed on the transparent electrode layer. By using a molten salt substrate with a melting point greater than the forming temperature of the absorption layer as the substrate for preparing the thin film solar cell, different types of thin film solar cells are ensured to be formed, which improves the adaptability of the method for preparing a stacked solar cell. The molten salt substrate is served as the substrate, combined with the characteristics of easy removal of molten salt substrate, which reduces the performance damage caused to the thin film solar cell during the operation of removing the substrate, and effectively improves the performance of the stacked solar cell. First, the thin film solar cell is formed on the molten salt substrate, after that, the thin film solar cell is attached to the bottom cell, which avoids the performance damage caused by directly preparing the thin film solar cell on the bottom cell, thereby ensuring the photoelectric conversion capability of the stacked solar cells, and reducing the difficulty of using the thin film solar cell sensitive to electrode structures to prepare the stacked solar cell.

BRIEF DESCRIPTION OF THE DRAWINGS

One or more embodiments are described as examples with reference to the corresponding figures in the accompanying drawings, and the exemplary description does not constitute a limitation to the embodiments. The figures in the accompanying drawings do not constitute a proportion limitation unless otherwise stated. For more clearly illustrating embodiments of the present application or the technical solutions in the conventional technology, drawings referred to for describing the embodiments or the conventional technology will be briefly described hereinafter. Apparently, drawings in the following description are only examples of the present application, and for the person skilled in the art, other drawings may be acquired based on the provided drawings without any creative efforts.

FIG. 22 is a schematic structural view of a solar cell provided according to another embodiment of the present application;

FIG. 23 is a schematic structural view of another solar cell provided according to an embodiment of the present application;

FIG. 24 is a schematic structural view of a photovoltaic module provided according to an embodiment of the present application.

DETAILED DESCRIPTION

Figure 1:
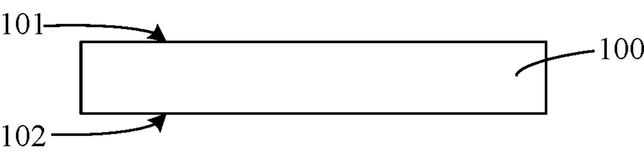
FIG. 1 to FIG. 9 are schematic views of a method for forming a monodisperse granular film provided according to an embodiment of the present application.

According to the background technology, it is difficult to prepare a monodisperse granular film with excellent performance and high integrity at present. Moreover, due to the influence of the method for preparing the stacked solar cell and solar cell characteristics, at present, the stacked solar cell has limitations in applicability and photoelectric conversion efficiency.

It is found in the analysis that the temporary substrate configured to form monodisperse granular film is mainly made of insoluble materials, such as glass, plastic foil, metal foil, etc. The use of insoluble temporary substrates has a problem of high removal difficulty and low removal success rate when removing the temporary substrate, especially when the prepared monodisperse granular film has a large area, even if an auxiliary separation layer is added between the temporary substrate and the monodisperse granular film.

It is also difficult to remove the temporary substrate, and it may also cause damage to the monodisperse granular film. The solar cell including the monodisperse particle film has poor adaptability, and the process of removing the substrate may cause performance damage to the thin film solar cell, thereby affecting the performance of the stacked solar cell.

To solve the above problems, the embodiment of the present application provides a monodisperse granular film and a method for forming the monodisperse granular film, as well as a photovoltaic cell. In the method for forming a monodisperse granular film, the initial substrate configured to bear the monodisperse granular layer is first provided, and the sacrificial layer, the adhesive layer and the monodisperse granular layer are formed on the initial substrate. The adhesive layer is between adjacent granules of the monodisperse granular layer, and is configured to bond and fix the multiple granules arranged dispersedly. The sacrificial layer is between the initial substrate and the multiple granules, and is configured to temporarily cover a lower surface of each of the multiple granules, so that in the monodisperse granular film obtained by subsequently removing the sacrificial layer, the adhesive layer is exposed between adjacent granules on a side of the multiple granules away from the initial substrate. In addition, the initial substrate configured to temporarily bear the multiple granules is a soluble substrate. Therefore, compared with the initial substrate made of glass, plastic foil, metal foil and other non-soluble materials, and the use of the method of tearing off the substrate, the embodiments of the present application provide a method in which the initial substrate can be removed by dissolution, which can easily remove the initial substrate, and the success rate of removing the initial substrate is high. In addition, the process of removing the initial substrate causes less damage to the monodisperse granular film, which is conducive to reducing the difficulty in forming the monodisperse granular film with excellent performance and high integrity.

In addition, a method for preparing solar cells is provided according to an embodiment of the present application. In the process of preparing the solar cell, a thin film solar cell is first prepared on a molten salt substrate with a melting point higher than the forming temperature of the absorption layer of the thin film solar cell. After that, the bottom cell is provided and attached to the thin film solar cell. The substrate is then removed and a transparent electrode layer is formed on the surface of the thin film solar cell. Grid lines are formed on the transparent electrode layer to obtain a stacked solar cell formed by stacking the bottom cell and the thin film solar cell. By using a molten salt substrate with a melting point greater than the forming temperature of the absorption layer as the substrate for preparing the thin film solar cell, different types of thin film solar cells are ensured to be formed, which improves the adaptability of the method for preparing a stacked solar cell. The molten salt substrate is served as the substrate, combined with the characteristics of easy removal of molten salt substrate, which reduces the performance damage caused to the thin film solar cell during the operation of removing the substrate, and effectively improves the performance of the stacked solar cell. First, the thin film solar cell is formed on the molten salt substrate, after that, the thin film solar cell is attached to the bottom cell, which avoids the performance damage caused by directly preparing the thin film solar cell on the bottom cell, thereby ensuring the photoelectric conversion capability of the stacked solar cells, and reducing the difficulty of using the thin film solar cell sensitive to electrode structures to prepare the stacked solar cell.

The embodiments of the present application will be described in detail below with reference to the accompanying drawings. However, those skilled in the art may appreciate that, in the various embodiments of the present application, numerous technical details are set forth in order to provide the reader with a better understanding of the present application. However, the technical solutions claimed in the present application may be implemented without these technical details and various changes and modifications based on the following embodiments.

FIG. 1 to FIG. 9 are schematic views of a method for forming a monodisperse granular film provided according to an embodiment of the present application. FIG. 10 to FIG. 14 are schematic views of a method for forming a monodisperse granular film provided according to another embodiment of the present application.

The method for forming a monodisperse granular film is as follows. Referring to FIG. 1, an initial substrate 100 is provided, which has a first surface 101 and a second surface 102 opposite to the first surface 101. The initial substrate 100 is configured to temporarily bear the monodisperse granular layer, which is conducive to form a single-layered monodisperse granular layer with granules arranged dispersedly. Moreover, the initial substrate 100 is a soluble substrate, which can be dissolved and removed in a specific solution at a lower temperature. Compared with the initial substrate 100 made of glass, plastic foil, metal foil and other non-soluble materials, and the use of the method of tearing off the substrate, the initial substrate 100 is removed by dissolution, which can easily remove the initial substrate 100, and the success rate of removing the initial substrate 100 is high. In addition, the process of removing the initial substrate 100 causes less damage to the monodisperse granular film, which is conducive to reducing the difficulty in forming the monodisperse granular film with excellent performance and high integrity.

In some embodiments, the initial substrate 100 includes molten salt or polyvinyl alcohol. The above materials are low cost and environmentally friendly soluble materials. The initial substrate 100 made of above materials is not only conducive to easily removing the initial substrate 100, but also conducive to avoiding environmental pollution and reducing the preparation cost of the monodisperse granular film.

Referring to FIG. 2 to FIG. 4, or FIG. 10 to FIG. 14, a sacrificial layer 111, an adhesive layer 112, and a monodisperse granular layer are formed over the first surface 101. The monodisperse granular layer includes multiple granules 120, and the multiple granules 120 are arranged dispersedly over the first surface 101. The sacrificial layer 111 is between the multiple granules 120 and the initial substrate 100, the adhesive layer 112 is between adjacent granules 120 of the multiple granules 120, and the adhesive layer 112 is exposed between adjacent granules 120 on a side of the multiple granules 120 away from the initial substrate 100. The adhesive layer 112 is between the adjacent granules 120 of the multiple granules 120 and is configured to bond and fix the multiple granules 120 arranged dispersedly. The sacrificial layer 111 is between the initial substrate 100 and the multiple granules 120, and is configured to temporarily cover a lower surface of each of the multiple granules 120, so that the adhesive layer 112 is exposed between adjacent granules 120 on a side of the multiple granules 120 away from the initial substrate 100 in the monodisperse granule film obtained by subsequent removing the sacrificial layer 111.

It should be noted that the multiple granules 120 arranged dispersedly in the monodisperse granular layer is that the multiple granules 120 are spaced along a direction perpendicular to the first surface 101 and pointing to the second surface 102. There is no contact or micro-contact between adjacent granules 120, and the multiple granules 120 may be screened granules with uniform granule size and monodispersity. The shape of each of the multiple granules 120 may be spherical, square, polyhedral, or other irregular shapes.

In some embodiments, the maximum distance between any two points on the outer surface of each of the multiple granules 120 ranges from 5 μm to 100 μm. That is, the size of each of the multiple granule 120 may be 5 μm to 100 μm. For example, it can be 10 μm, 20 μm, 25 μm, 50 μm or 80 μm. The advantage of this setting is that in some embodiments, the multiple granules 120 are configured to realize the directional transport of carriers. In response to the size of each of the multiple granules 120 being excessive, the transport distance of carriers between the upper surface and the lower surface of each of the multiple granules 120 is excessive, resulting in excessive consumption of carriers during the transport process, and even difficult to complete carrier migration, thus reducing the performance of monodisperse granular film. In response to the size of each of the multiple granules 120 being too small, the distance between the upper surface and the lower surface of each of the multiple granules 120 is too short, resulting in minority carrier recombination, which will affect the directional transmission of most carriers. In addition, in response to the size of each of the multiple granules 120 being too small, the thickness of monodisperse granular film will also be small. In response to there being a certain potential difference between the two surfaces of monodisperse granular film, the probability of the multiple granules 120 in a thin monodisperse granular film to decompose is greatly increased, leading to the decline of the stability of the monodisperse granular film. Therefore, the maximum distance between any two points on the outer surface of each of the multiple granules 120 is set to range from 5 μm to 100 μm. It is beneficial to ensure that the multiple granules 120 have better carrier transport capacity, and to improve the stability of the monodisperse granular film.

In some embodiments, a ratio of the area of an orthographic projection of each of the multiple granules 120 over the first surface 101 to an area of the first surface 101 ranges from 30% to 90%, for example, it can be 35%, 40%, 50%, 55% or 75%. In response to the monodisperse granular film being configured for photoelectric conversion, a light absorption area of the monodisperse granular film can be regarded as the sum of orthogonal projection areas of all the multiple granules 120 over the first surface 101. However, the area of the monodisperse granular film for receiving light is the same as the area of the first surface 101. In response to the ratio of the area of the orthographic projection of each of the multiple granules 120 over the first surface 101 to the area of the first surface 101 being too small, the absorption and utilization rate of light irradiated on monodisperse granular film will be low. Due to the limitation of the photoelectric conversion capability of the multiple granules 120 itself, there is an upper limit for the absorption and utilization rate of the light irradiated on the monodisperse granular film by the monodisperse granular film. In response to the ratio of the area of the orthographic projection of each of the multiple granules 120 over the first surface 101 to the area of the first surface 101 being excessive, it will lead to the existence of part of the multiple granules 120 in the monodisperse granular film whose photoelectric conversion capability is not fully utilized, resulting in a low preparation cost of the monodisperse granular film and a low photoelectric conversion capability. Therefore, the ratio of the area of the orthographic projection of each of the multiple granules 120 over the first surface 101 to the area of the first surface 101 is set to range from 30% to 90%, which is not only conducive to improve the light absorption and utilization rate of the monodisperse granular film, but also conducive to reduce the preparation cost of the monodisperse granular film.

In some embodiments, the multiple granules 120 include at least one of semiconductor granules or ion transport granules. Specifically, in response to the multiple granule 120 being semiconductor granules, the monodisperse granule film can be used to form a solar cell. In response to the multiple granules 120 being ion transport granules, the monodisperse granular film can be used to form a lithium battery, etc.

In some embodiments, the multiple granules 120 are perovskite granules. The monodisperse granular film can be used to form perovskite solar cell, which have outstanding advantages such as high photoelectric conversion efficiency, flexible preparation, and low cost.

Figure 2:
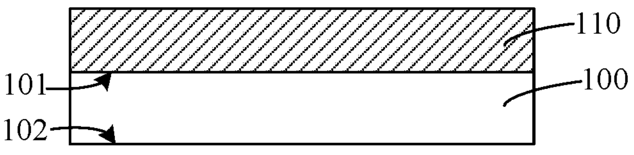
Figure 3:
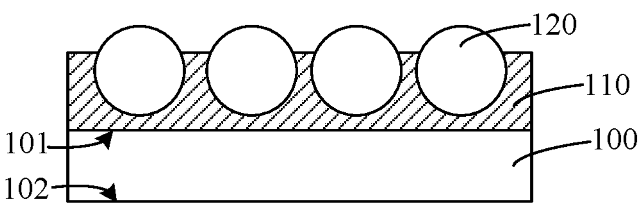
Figure 4:
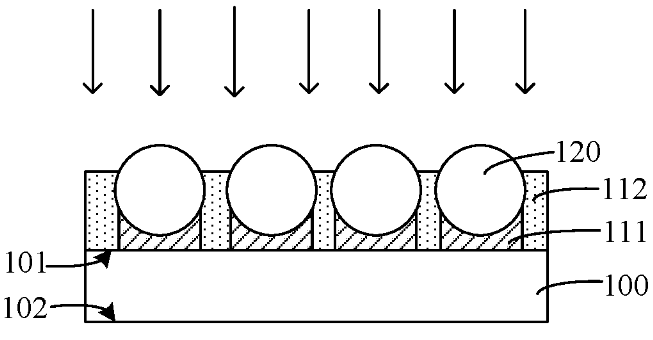
Figure 5:
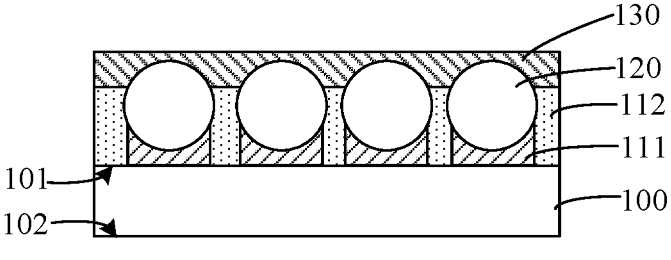

In some embodiments, forming the sacrificial layer 111, the adhesive layer 112 and the monodisperse granular layer includes following operations. Referring to FIG. 2 to FIG. 3, the initial adhesive layer 110 and the monodisperse granular layer are formed over the first surface 101, where the initial adhesive layer 110 is between the multiple granules 120 and the initial substrate 100, and between the adjacent granules 120 of the multiple granules 120, and the initial adhesive layer 110 is exposed between adjacent granules 120 on a side of the multiple granules 120 away from the initial substrate 100. Specifically, referring to FIG. 2, the initial adhesive layer 110 can be coated over the first surface 101. The thickness of the initial adhesive layer 110 depends on the granule size and the granule coverage rate, that is, the overflow of the initial adhesive layer 110 after the multiple granules are embedded should be considered to ensure that the initial adhesive layer 110 is exposed between adjacent granules 120 on a side of the multiple granules 120 away from the initial substrate 100. Referring to FIG. 3, the multiple granules 120 are evenly spread on the initial adhesive layer 110, and excess granules 120 are shaken off. Pressure is applied to half-embed the granules 120 into the initial adhesive layer 110. Referring to FIG. 4, the initial adhesive layer 110 between adjacent granules 120 is cured to form an adhesive layer 112; The initial adhesive layer 110 between the multiple granules 120 and the initial substrate 100 is served as the sacrificial layer 111.

In some embodiments, the initial adhesive layer 110 includes negative photoresist. After the multiple granules 120 are embedded into the initial adhesive layer 110, it also includes pre-heating the negative photoresist with high fluidity to remove the solvent in the negative photoresist, so as to realize the pre-curing of the negative photoresist. Curing the initial adhesive layer 110 between adjacent granules 120 includes the following operations. Referring to FIG. 4, the initial adhesive layer 110 is exposed on a side of the initial adhesive layer 110 away from the initial substrate 100. Due to the shielding of the multiple granules 120, the initial adhesive layer 110 between adjacent granules 120 is exposed, and the adhesive layer 112 can be formed after curing. The initial adhesive layer 110 between the multiple granules 120 and the initial substrate 100 is not exposed and still can be dissolved and removed. Therefore, the initial adhesive layer 110 between the multiple granules 120 and the initial substrate 100 can be used as the sacrificial layer 111. The negative photoresist is used in the initial adhesive layer 110, and the sacrificial layer 111 and the adhesive layer 112 are formed by exposure processing, which is conducive to reduce the difficulty in forming the sacrificial layer 111 and the adhesive layer 112.

Figure 10:
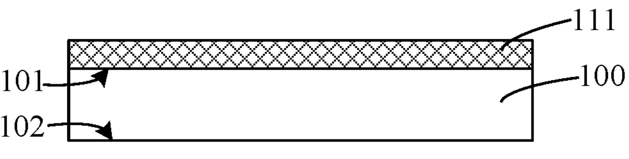
FIG. 10 to FIG. 14 are schematic views of a method for forming a monodisperse granular film provided according to another embodiment of the present application.
Figure 11:
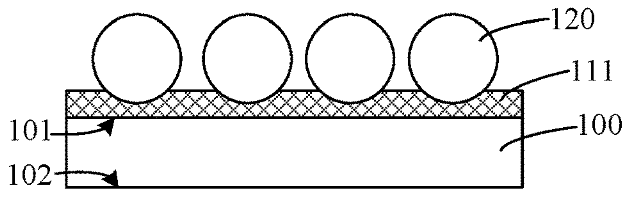

In some embodiments, forming the sacrificial layer 111, the adhesive layer 112 and the monodisperse granular layer includes the following operations. Referring to FIG. 10 to FIG. 11, the sacrificial layer 111 and the monodisperse granular layer are formed over the first surface 101, and the sacrificial layer 111 is between the multiple granules 120 and the initial substrate 100. Specifically, referring to FIG. 10, a layer of the sacrificial layer 111 is coated over the first surface 101 of the initial substrate 100. The multiple granules 120 are evenly arranged on the sacrificial layer 111, excess granules 120 are shaken off, the sacrificial layer 111 is heated and softened, and pressure is applied to partially embed the multiple granules 120 into the sacrificial layer 111. In this way, the sacrificial layer 111 covering the lower surface of each of the multiple granules 120 can be formed.

In some embodiments, the sacrificial layer 111 includes a thermoplastic polymer, which can be soften by being heated, and can be cured when cooling, and can be re-softening. The sacrificial layer 111 is made of the thermoplastic polymer, which is conducive to reduce the difficulty in forming the sacrificial layer 111 and the monodisperse granular layer, as well as the difficulty in subsequently removing the sacrificial layer 111.

Figure 12:
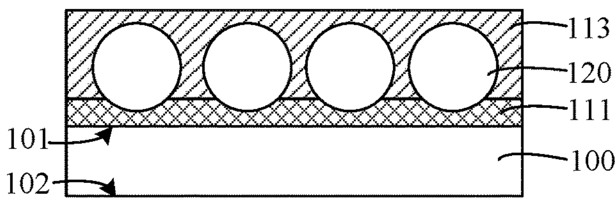
Figure 13:
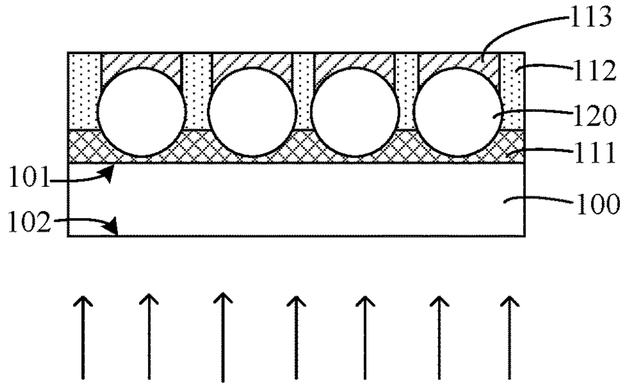
Figure 14:
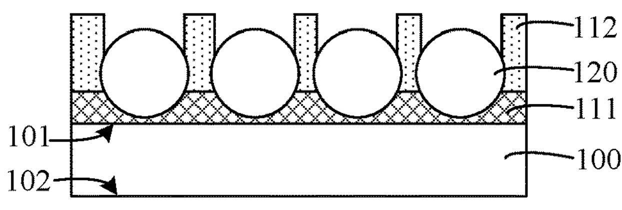

Referring to FIG. 12, the initial adhesive layer 110 is formed, which is between adjacent granules 120 of the multiple granules, and on a part of the surface of each of the multiple granules 120 away from the initial substrate 100. Referring to FIG. 13, the initial adhesive layer 110 between adjacent granules 120 is cured to form the adhesive layer 112. Referring to FIG. 14, the initial adhesive layer 110 between adjacent granules on a side of the multiple granules away from the initial substrate 100 is dissolved and removed.

In some embodiments, the initial adhesive layer 110 includes negative photoresist. After the initial adhesive layer 110 is formed, the method further includes the following operations. The negative photoresist with high fluidity is pre-heated to remove the solvent in the negative photoresist, so as to realize the pre-curing of the negative photoresist. Curing the initial adhesive layer 110 between adjacent granules 120 includes the following operations. Referring to FIG. 13, the initial adhesive layer 110 is exposed on the side of the initial substrate 100 away from the first surface 101. It should be noted that the initial substrate 100 and the sacrificial layer 111 are made of transparent materials. In this way, the light used in the exposure processing can be irradiated on the initial adhesive layer 110 between adjacent granules 120 through the initial substrate 100 and the sacrificial layer 111, that is, the initial adhesive layer 110 between adjacent granules 120 is exposed, and the adhesive layer 112 can be formed after the subsequent curing. Due to the shielding of the multiple granules 120, the initial adhesive layer 110 on the upper surface of each of the multiple granules 120 away from the initial substrate 100 has not been exposed, and is still soluble and can be removed by dissolution after curing. The initial adhesive layer 110 includes negative photoresist, and the adhesive layer 112 is formed by exposure processing, which is beneficial to reduce the difficulty in forming the adhesive layer 112.

It should be noted that the curing can implemented by annealing treatment on the exposed negative photoresist.

In some embodiments, after the sacrificial layer 111, the monodisperse granular layer and the adhesive layer 112 are formed, the initial substrate 100 and the sacrificial layer 111 can be directly removed. In other embodiments, referring to FIG. 5, before removing the initial substrate 100, the method further includes the following operations. The first functional layer 130 is formed, and the first functional layer 130 is between adjacent granules on a side of the multiple granules 120 away from the initial substrate 100, and on a surface of the adhesive layer 120 away from the initial substrate 100.

In some embodiments, the first functional layer 130 includes a conductive material or a semiconductor material. Specifically, the first functional layer 130 can be selected according to the application scenario of the monodisperse granular film. Specifically, the first functional layer 130 can be formed by deposition, including magnetron sputtering or chemical vapor deposition.

In some embodiments, the first functional layer 130 may be a single-layer structure. In other embodiments, the first functional layer 130 may also be a stacked structure. Specifically, it can be set according to the application scenario of the monodisperse granular film.

Figure 6:
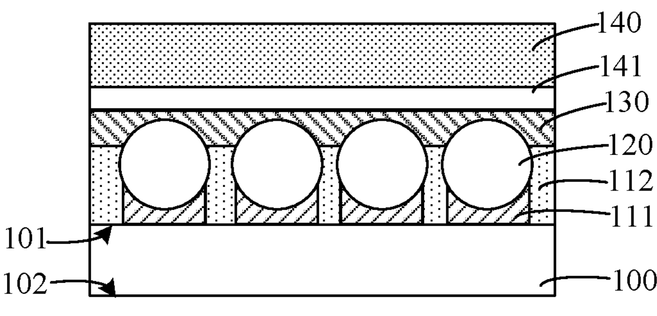

In some embodiments, referring to FIG. 6, after the first functional layer 130 is formed, the method further includes forming a substrate 140, which is over a surface of the first functional layer 130 away from the multiple granules 120. The substrate 140 and the first functional layer 130 are conducive to enhancing the strength of the monodisperse granular film, and the initial substrate 100 is configured to support the monodisperse granular film, which is conducive to reducing the difficulty in forming the first functional layer 130 and the substrate 140.

In some embodiments, referring to FIG. 6, forming the substrate 140 includes the following operations. The substrate 140 is attached to the surface of the first functional layer 130 away from the initial substrate 100 by using the adhesive layer 141, where the adhesive layer 141 may be transparent glue or non-transparent glue, and the adhesive layer 141 may also be conductive glue or non-conductive glue.

It should be noted that in response to a monodisperse granular film without being supported by the substrate is prepared, the operation of forming the substrate can be omitted.

Figure 7:
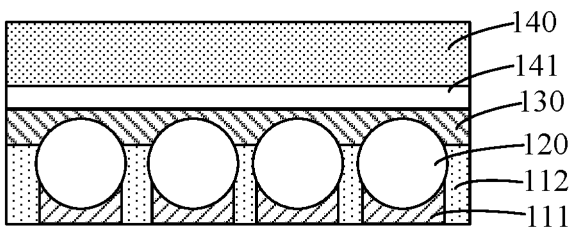
Figure 8:
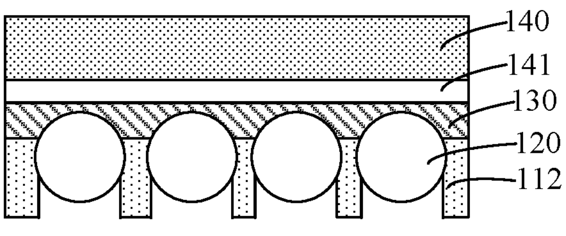

Referring to FIG. 7, the initial substrate 100 is dissolved and removed. Referring to FIG. 8, the sacrificial layer 111 is dissolved and removed. It should be noted that in some embodiments, the initial substrate 100 and the sacrificial layer 111 can also be dissolved and removed simultaneously.

Figure 9:
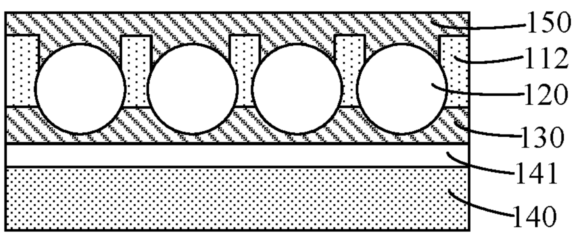

In some embodiments, referring to FIG. 9, after the sacrificial layer 111 is removed, the method further includes: forming a second functional layer 150, where the second functional layer 150 is between adjacent granules 120 on a side of the multiple granules 120 away from the first functional layer 130, and on a surface of the adhesive layer 112 away from the first functional layer 130.

In some embodiments, the second functional layer 150 may be a conductive material or a semiconductor material. Specifically, it can be selected according to the application scenario of the monodisperse granular film. Specifically, the second functional layer 150 can be formed by deposition, including magnetron sputtering or chemical vapor deposition.

In some embodiments, the second functional layer 150 may be a single-layer structure. In other embodiments, the second functional layer 150 may also be a stacked structure.

Specifically, it can be set according to the application scenario of the monodisperse granular film.

In the method for forming the monodisperse granular film provided according to the above embodiments, the initial substrate 100 configured to bear the monodisperse granular layer is first provided, and the sacrificial layer 111, the adhesive layer 112 and the monodisperse granular layer are formed on the initial substrate 100. The adhesive layer 112 is between adjacent granules 120 of the monodisperse granular layer, and is configured to bond and fix the multiple granules 120 arranged dispersedly. The sacrificial layer 111 is between the initial substrate 100 and the multiple granules 120, and is configured to temporarily cover a lower surface of each of the multiple granules 120, so that in the monodisperse granular film obtained by subsequently removing the sacrificial layer 111, the adhesive layer 112 is exposed between adjacent granules 120 on a side of the multiple granules 120 away from the initial substrate 100. In addition, the initial substrate 100 configured to temporarily bear the multiple granules 120 is a soluble substrate. Therefore, compared with the initial substrate 100 made of glass, plastic foil, metal foil and other non-soluble materials, and the use of the method of tearing off the substrate, the embodiments of the present application provide a method in which the initial substrate 100 can be removed by dissolution, which can easily remove the initial substrate 100, and the success rate of removing the initial substrate 100 is high. In addition, the process of removing the initial substrate 100 causes less damage to the monodisperse granular film, which is conducive to reducing the difficulty in forming the monodisperse granular film with excellent performance and high integrity. Moreover, the method for forming the monodisperse granular film provided according to the embodiments of the present application realizes that the monodisperse granular film is formed at low temperature, which is conducive to making the monodisperse granular film suitable for more application scenarios.

According to some embodiments of the present application, another aspect of the embodiments of the present application further provides a monodisperse granular film. The monodisperse granular film is formed by the method for forming the monodisperse granular film described in any of the above embodiments. It should be noted that the same or corresponding parts as the above embodiments can refer to the detailed description of the above embodiments, which will not be described in detail below.

Figure 15:
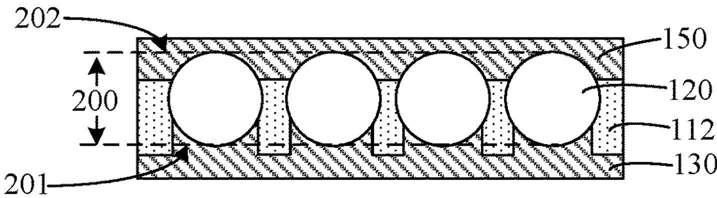
FIG. 15 is a schematic structural view of a monodisperse granular film provided according to an embodiment of the present application.

FIG. 15 is a schematic structural view of a monodisperse granular film provided according to an embodiment of the present application.

Referring to FIG. 15, the monodisperse granule film includes a monodisperse granular layer 200 having a first side 201 and a second side 202 opposite to the first side 201, the monodisperse granular layer 200 includes multiple granules 120 arranged in a direction perpendicular to the first side 201 and pointing to the second side 202. The monodisperse granule film further includes an adhesive layer 112 between adjacent granules 120 of the multiple granules 120. There is no contact or micro contact between adjacent granules 120, and the multiple granules 120 can be screened granules with the same granule size and monodispersity. The shape of each of the multiple granules 120 may be spherical, square, polyhedral, or other irregular shapes.

In some embodiments, the multiple granules 120 include at least one of semiconductor granules or ion transport granules. Specifically, in an example, the multiple granules 120 are perovskite granules.

Referring to FIG. 15, in some embodiments, the monodisperse granular film further includes a first functional layer 130 between adjacent granules 120 on a side of the multiple granules 120 away from the second side 202, and on a surface of the adhesive layer 112 away from the second side 202. The first functional layer 130 may be conductive material or semiconductor material. Specifically, the first functional layer 130 can be selected according to the application scenario of the monodisperse granular film.

Referring to FIG. 9, in some embodiments, the monodisperse granular film further includes a substrate 140 over a surface of the first functional layer 130 away from the multiple granules 120. The substrate 140 includes conductive material, semiconductor material or insulating material. Specifically, the substrate 140 can be selected according to the application scenario of the monodisperse granular film.

Referring to FIG. 9, in some embodiments, there is an adhesive layer 141 between the substrate 140 and the first functional layer 130, and the adhesive layer 141 is configured to fix the substrate 140 and the first functional layer 130.

Referring to FIG. 15, in some embodiments, the monodisperse granular film further includes a second functional layer 150 between adjacent granules 120 on a side of the multiple granules 120 away from the first side 201, and on the surface of the adhesive layer 112 away from the first side 201. The second functional layer 150 includes conductive material or semiconductor material. Specifically, the second functional layer 150 can be selected according to the application scenario of the monodisperse granular film.

The monodisperse granular film provided according to the above embodiments has high integrity, and has better performance because the forming of the monodisperse granular film causes less damage to the monodisperse granular film.

According to some embodiments of the present application, still another aspect of the embodiments of the present application further provides a photovoltaic cell, which includes the monodisperse granular film according to any of the above embodiments.

In some embodiments, the granules in the monodisperse granular film is semiconductor granules, such as perovskite granules. The photovoltaic cell is a perovskite solar cell.

Specifically, the monodisperse granular film includes the first functional layer, the monodisperse granular layer, the adhesive layer and the second functional layer. Multiple granules in the monodisperse granular layer are perovskite granules. The photovoltaic cell includes: a first conductive layer, a first carrier transport layer, a perovskite absorption layer and a second conductive layer arranged in a stacked manner in sequence. The monodisperse granular layer and the adhesive layer between the adjacent granules of the multiple granules together serves as the perovskite absorption layer, the first functional layer serves as the first carrier transport layer, and the second functional layer serves as the second conductive layer.

The first conductive layer and the second conductive layer is composed of metal grid lines or a conductive film.

In some embodiments, the first carrier transport layer is a hole transport layer or an electron transport layer. The first carrier transport layer is configured to collect and transport carriers generated in the perovskite absorption layer.

In some embodiments, the solar cell further includes a second carrier transport layer. The second carrier transport layer is between the perovskite absorption layer and the second conductive layer. The second functional layer of the monodisperse granular film serves as the second carrier transport layer. Corresponding carrier transport layers are respectively arranged on the opposite sides of the perovskite absorption layer, which is conducive to further improving the efficiency of the solar cell.

In some embodiments, the first carrier transport layer is the hole transport layer, and the second carrier transport layer is the electron transport layer. In other embodiments, the first carrier transport layer is the electron transport layer, and the second carrier transport layer is the hole transport layer.

Figure 16:
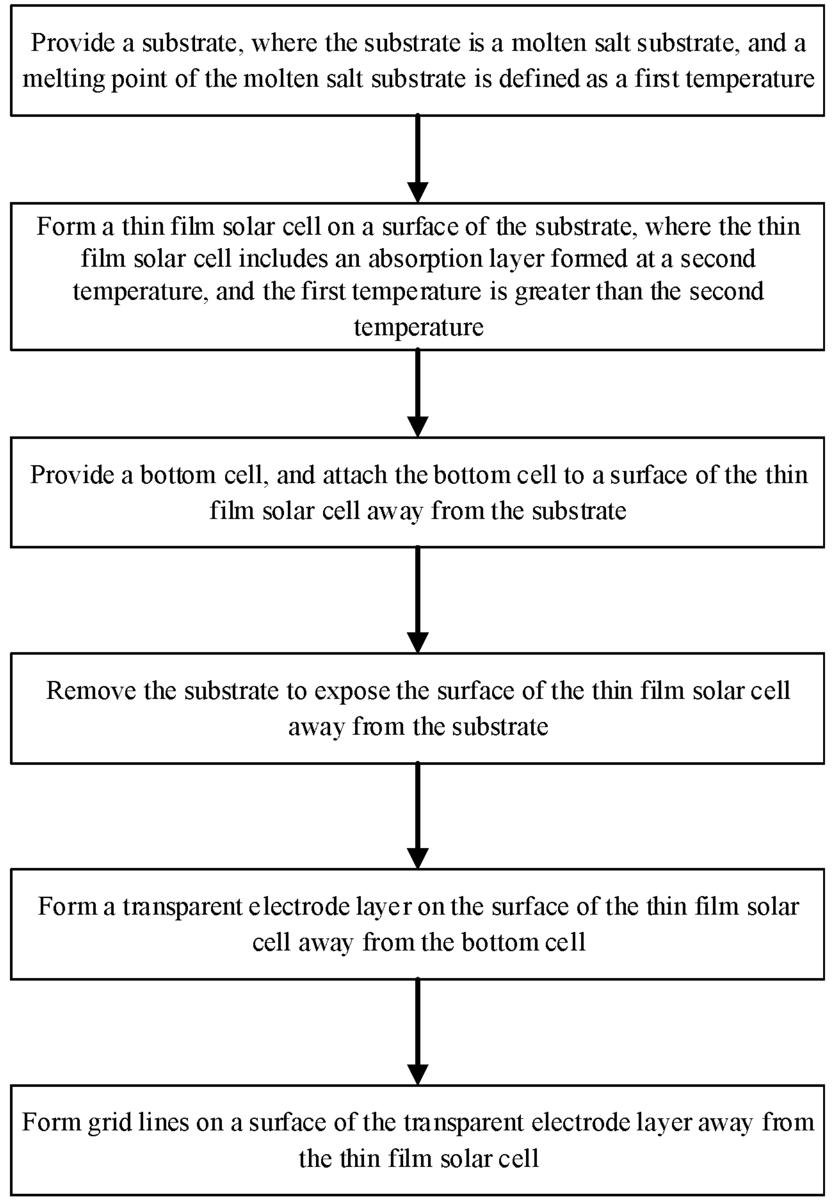
FIG. 16 is a flowchart of a method for preparing a solar cell provided according to an embodiment of the present application.

A method for preparing a solar cell is provided according to an embodiment of the present application, the method is applied to solar cell production equipment, and the process of preparing the solar cell can refer to FIG. 16.

Figure 17:
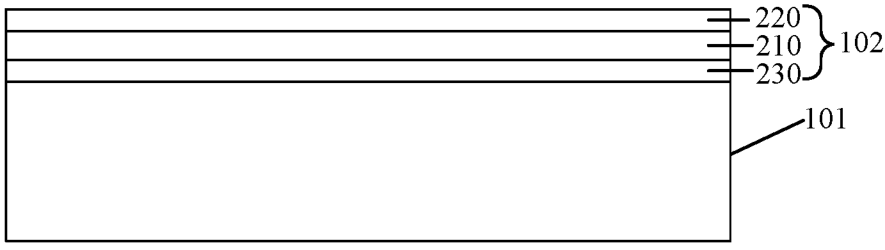
FIG. 17 is a schematic structural view of a semi-finished solar cell provided according to an embodiment of the present application.

Referring to FIG. 16 and FIG. 17, a substrate 101 is provided, which is a molten salt substrate with a melting point of the first temperature. Among them, FIG. 17 is a schematic structural view of the solar cell after a thin film solar cell 102 is prepared. The thin film solar cell 102 includes an absorption layer 210, a first functional layer 220, and a second functional layer 230.

In the process of preparing the solar cell, a molten salt substrate with a shape similar to the target shape can be provided as the substrate 101 based on the target shape and size of the solar cell. The size of the substrate 101 is larger than the target size of the solar cell. Among them, size refers to the length, width, and area of the light receiving surface of the solar cell. The length, width, and area of the substrate 101 are all greater than or equal to the target size of the solar cell.

It should be understood that a molten salt substrate refers to a matrix formed by salt particles entering the molten state at a temperature higher than the melting point. During the preparation of a molten salt substrate, the molten salt substrate is formed by high-pressure pressing of salt particles or heating the salt particles to a molten state, so that a molten salt substrate is formed by molten crystallization, which will not be limited to the embodiments of the present application.

In some embodiments, the substrate 101 includes sodium chloride, potassium iodide, ammonium chloride, or potassium hydroxide.

In the process of selecting materials for substrate 101, considering the subsequent preparation of thin film solar cell 102 on substrate 101, in order to prevent the migration of molten salt ions from the substrate 101 to the thin film solar cell 102 from causing damage, materials with weaker ion migration ability are selected for the construction of molten salt substrates. Among them, molten salt ions refer to the metal cations and non-metallic anions present in the molten salt substrate. Therefore, in the process of constructing the substrate 101, sodium chloride particles, potassium iodide particles, ammonium chloride particles, or potassium hydroxide particles can be used as materials for constructing a molten salt substrate, and then high-pressure pressing or melting crystallization can be used to form a molten salt substrate as the substrate 101. By utilizing materials that are not prone to ion migration for the construction of the substrate 101, the interference of ion migration in the substrate 101 on the preparation of the thin film solar cell 102 is reduced, and the photoelectric conversion capability of the thin film solar cell 102 is ensured as much as possible.

It should be understood that in the process of constructing substrate 101, the selected materials can not only be the same particle, but also a combination of multiple particles. For example, any two, three, or four of sodium chloride particles, potassium iodide particles, ammonium chloride particles, and potassium hydroxide particles can be used together to construct substrate 101, and sodium fluoride particles can also be used Potassium fluoride particles or other particles can be used to construct substrate 101, or multiple particles can be used together to construct substrate 101. In the process of using multiple particles for substrate 101 construction, priority can be given to selecting multiple particles with relatively close melting points for combination, reducing the difficulty of implementation during the substrate 101 construction process. Among them, the closer melting point refers to the temperature difference between the melting points being less than or equal to 300 degrees Celsius.

It is worth mentioning that there are various types of the thin film solar cell 102, and during the construction process of the substrate 101, the selection of materials to form a molten salt substrate can also be based on whether the molten salt substrate is harmful to the thin film solar cell 102. Priority should be given to selecting materials that have gain or are harmless for the construction of the substrate 101 for the thin film solar cell 102. For example, in response to the thin film solar cell 102 being a cadmium telluride thin film solar cell, particles containing antimony or vanadium elements can be selected as the preferred materials for the construction of the substrate 101. In response to the thin film solar cell 102 being a copper indium gallium selenium thin film solar cell, particles containing sodium, potassium, and cesium elements can be preferentially selected for the construction of the substrate 101. By selecting materials that have gain or are harmless to the thin film solar cell 102 and constructing the substrate 101, the defects introduced during the preparation process of the thin film solar cell 102 are reduced, and the morphology and photoelectric conversion effect of the thin film solar cell 102 are improved.

In some embodiments, the thermal expansion coefficient of the substrate 101 is less than or equal to $5\times10^{-5}$/K.

Since some types of the thin film solar cell 102 needs to be prepared at a high temperature, for example, the inorganic thin film solar cell is formed in more than 300 degrees Celsius, therefore, in response to the thermal expansion coefficient of the substrate 101 being excessive during the preparation of the thin film solar cell 102 on the substrate 101, the substrate 101 may undergo significant volume changes due to thermal expansion. In response to the volume change of substrate 101 being excessive, the flatness and thickness uniformity of the prepared thin film solar cell 102 is affected, resulting in the morphology of the thin film solar cell 102 not meeting the requirements or expectations, and reducing the yield of the finished product.

Therefore, during the preparation process of the thin film solar cell 102 on the substrate 101, in order to ensure the quality of the prepared thin film solar cell 102, it is necessary for the volume expansion of the substrate 101 to be small at a high temperature, thereby reducing the interference of expansion of the substrate 101 on the preparation of thin film solar cell 102. During the construction of substrate 101, the thermal expansion coefficient of the substrate 101 is controlled within $5\times10^{-5}$/K, for example, the thermal expansion coefficient of the substrate 101 are controlled at $4.8\times10^{-5}$/K, $4.5\times10^{-5}$/K, $4\times10^{-5}$/K, $3\times10^{-5}$/K, $1\times10^{-5}$/K, $7.5\times10^{-6}$/K, $5\times10^{-6}$/K, $2.5\times10^{-6}$/K, $1\times10^{-6}$/K, $7.5\times10^{-7}$/K or $5\times10^{-7}$/K, etc. By controlling the thermal expansion coefficient of substrate 101 to be less than or equal to $5\times10^{-5}$/K, excessive volume changes of substrate 101 under high temperatures are avoided, which reduces the interference of thermal expansion of the substrate 101 on the preparation of the thin film solar cell 102, and improves the yield of the thin film solar cell 102.

The thin film solar cell 102 is formed on the surface of the substrate 101, which includes an absorption layer 210 formed at a second temperature, and the first temperature is greater than the second temperature.

After a molten salt substrate is provided as the substrate 101, based on the target shape of the solar cell, the thin film solar cell 102 is prepared on a surface that is consistent with the target shape of the substrate 101. The formation temperature of the absorption layer 210 in the thin film solar cell 102 is the second temperature, which is lower than the melting point of the molten salt substrate as the substrate 101, that is, the second temperature is lower than the first temperature.

By selecting a molten salt substrate with a melting point greater than the formation temperature of the absorption layer 210 of the thin film solar cell 102 as the substrate 101, the damage to the morphology and performance of the thin film solar cell 102 caused by the melting of the part adjacent to the substrate 101 during the preparation process of the thin film solar cell 102 is avoided, and the yield of the thin film solar cell 102 is improved.

Among them, some of the processes for preparing the thin film solar cell 102 can refer to traditional high-efficiency thin film solar cells. For example, in response to the thin film solar cell 102 being a cadmium telluride thin film solar cell, the traditional process involves adding a cadmium sulfide buffer layer on conductive glass, forming a cadmium telluride absorption layer, and using laser marking to connect small cells in series. The cell structure using laser marking in series will make it difficult to apply cadmium telluride thin film solar cells to double ended stacked solar cells, and due to the low lateral conductivity of conductive glass, additional grid lines need to be deposited to achieve carrier transport, which is costly. In response to the method described in the present application being used to prepare cadmium telluride thin film solar cell, functional layers such as cadmium sulfide buffer layer, cadmium telluride absorption layer, cadmium telluride window layer, and transparent electrode layer are sequentially deposited on the substrate 101 in a direction perpendicular to the surface of the substrate 101. After the substrate 101 is removed, the electrode layer on the other side can be deposited, and the solar cells are connected in series using a welding strip, which is convenient for application to double-end stacked solar cell.

In response to the thin film solar cell 102 being a copper indium gallium selenium thin film solar cell, the traditional process involves sequentially forming a back electrode, an absorption layer, a buffer layer, and a transparent electrode layer as a window layer on the molybdenum glass. In the process of preparing stacked solar cells, the molybdenum glass needs to be removed and replaced with a transparent electrode layer. The removal of molybdenum glass is extremely difficult, therefore, the difficulty and cost of applying copper indium gallium selenium thin film solar cell to stacked solar cells are extremely high. In response to the method described in the present application being used to prepare copper indium gallium selenium thin film solar cell, a molten salt substrate is used as the substrate 101, and functional layers such as back electrode, absorption layer, buffer layer, and window layer are sequentially deposited on the substrate 101 to ensure that the copper indium gallium selenium thin film solar cell has high photoelectric conversion efficiency as much as possible. In addition, the characteristics of the molten salt substrate are utilized to make the substrate 101 easy to remove, which greatly reduces the difficulty and cost of preparing stacked solar cell using the copper indium gallium selenium thin film solar cell.

In some embodiments, the difference between the first temperature and the second temperature is not less than 100 degrees Celsius.

During the preparation process of the thin film solar cell 102 on substrate 101, due to the high formation temperature of the absorption layer 210, the side where substrate 101 comes into contact with thin film solar cell 102 will absorb a large amount of heat. In response to the melting point of the molten salt substrate serving as substrate 101 being not high enough, the side where substrate 101 comes into contact with thin film solar cell 102 may soften and deform due to excessive heat absorption, which leads to damage to the morphology and performance of the thin film solar cell 102 produced. Therefore, in the process of preparing the thin film solar cell 102, based on the formation temperature of the absorption layer 210 of the thin film solar cell 102, a molten salt substrate with a melting point higher than the formation temperature of the absorption layer 210 is selected as the substrate 101, which ensures that the first temperature is greater than the second temperature, and the difference between the first temperature and the second temperature is not less than 100 degrees Celsius. For example, the first temperature is 110 degrees Celsius, 150 degrees Celsius, 175 degrees Celsius, 200 degrees Celsius, 275 degrees Celsius, 350 degrees Celsius, or 500 degrees Celsius higher than the second temperature. By controlling the difference between the first temperature and the second temperature within a range of no less than 100 degrees Celsius, the yield of the prepared thin film solar cell 102 is improved.

In some embodiments, the second temperature ranges from 300 degrees Celsius to 1000 degrees Celsius.

For the thin film solar cell 102 with an absorption layer 210 formed at a temperature higher than 300 degrees Celsius, it is generally necessary to prepare them on glass with special materials. However, it is difficult to separate the thin film solar cell 102 from the glass after preparation. Therefore, it is very difficult to form efficient stacked solar cell 102 using glass as the carrier plate. It is difficult to directly prepare thin film solar cell 102 on the surface of pre prepared solar cells, and it is likely to cause irreversible performance damage to the pre prepared solar cells, especially for heterojunction solar cells. For thin film solar cell 102 with an absorption layer 210 formed at a temperature higher than 1000 degrees Celsius, the melting point requirement for the molten salt substrate as the substrate 101 is too high, resulting in excessive cost and difficulty in forming the molten salt substrate.

In response to the formation temperature of the absorption layer 210 of the thin film solar cell 102 being within the range of 300 degrees Celsius to 1000 degrees Celsius, for example, when the formation temperature of the absorption layer 210 is the second temperature, such as 350 degrees Celsius, 375 degrees Celsius, 400 degrees Celsius, 450 degrees Celsius, 480 degrees Celsius, 550 degrees Celsius, 585 degrees Celsius, 625 degrees Celsius, 680 degrees Celsius, 750 degrees Celsius, 840 degrees Celsius, 900 degrees Celsius, or 955 degrees Celsius, etc. The preparation of the thin film solar cell 102 using a molten salt substrate with a melting point 100 degrees Celsius or above higher than the absorption layer 210 as the substrate 101 can not only ensure the photoelectric conversion capability of thin film solar cell 102, but also avoid damage to the pre prepared solar cells when preparing thin film solar cell 102 on the surface of the pre-prepared solar cell, thereby facilitating the preparation of high-performance stacked solar cell.

Figure 18:
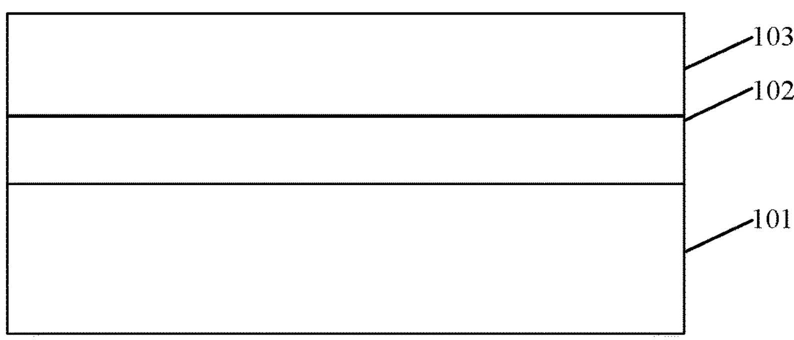
FIG. 18 is a schematic structural view of another semi-finished solar cell provided according to an embodiment of the present application.

Referring to FIG. 16 to FIG. 18, a bottom cell 103 is provided, and the bottom cell 103 is attached to the surface of the thin film solar cell 102 away from the substrate 101. Among them, FIG. 18 is a schematic structural view diagram of the solar cell after the bottom cell 103 is attached to the thin film solar cell 102.

After the thin film solar cell 102 is prepared on the surface of the substrate 101, a pre-prepared bottom cell 103 is provided, and then the surface of the bottom cell 103 is attached or adhered to the surface of the thin film solar cell 102 away from the substrate 101. The bottom cell 103 and the thin film solar cell 102 are used to form a stacked solar cell.

It is worth mentioning that before providing the bottom cell 103, the target heterojunction type of the bottom cell 103 can be determined based on the heterojunction type of the thin film solar cell 102, that is, whether the heterojunction of the bottom cell 103 is a P-N junction or an N-P junction, the bottom cell 103 that can meet the heterojunction type requirements of the thin film solar cell 102 can be provided.

Figure 19:
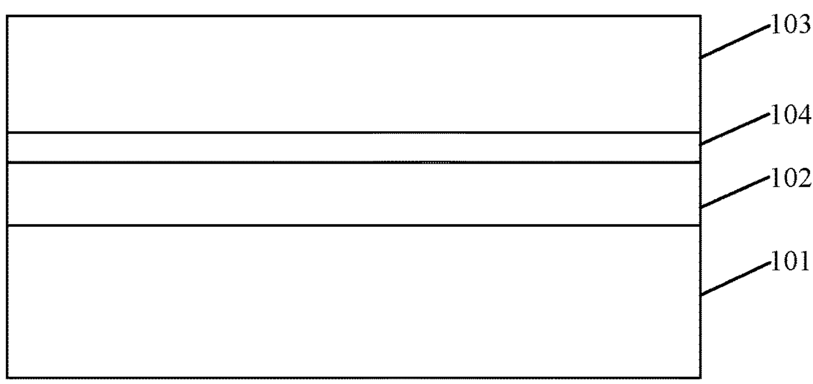
FIG. 19 is a schematic structural view of still another semi-finished solar cell provided according to an embodiment of the present application.

Refer to FIG. 16 to FIG. 19, where FIG. 19 is a schematic diagram of the structure of the solar cell that achieves the adhesion between the thin film solar cell 102 and the bottom cell 103 through the bonding layer 104. In some embodiments, the operation of attaching the bottom cell 103 to the surface of the thin film solar cell 102 away from the substrate 101 includes forming a bonding layer 104 between the bottom cell 103 and the thin film solar cell 102. The two opposite surfaces of the bonding layer 104 are adhered to the surface of the thin film solar cell 102 far from the substrate 101 and the bottom cell 103, respectively.

In the process of constructing stacked solar cells using bottom cell 103 and thin film solar cell 102, the bottom cell 103 is attached to the thin film solar cell 102 by bonding or adhering. In response to the bottom cell 103 is bonded to the thin film solar cell 102, after completing the preparation of the thin film solar cell 102, a bonding layer 104 is formed between the pre prepared bottom cell 103 and the thin film solar cell 102. The bonding layer 104 is formed by two opposite surfaces, which are respectively connected to the surface of the thin film solar cell 102 far from the substrate 101 and the bonding layer 104 of the bottom cell 103. The bottom cell 103 is attached to the thin film solar cell 102 to form a stacked solar cell. The bonding layer 104 used to complete the stacking of bottom cell 103 and the thin film solar cell 102 improve the stacking efficiency, reduce implementation difficulty and cost, and avoids damage to battery performance during the stacking process, thereby ensuring the photoelectric conversion efficiency of the produced stacked solar cell as much as possible.

The bonding layer 104 can be formed by adding conductive particles to a transparent adhesive with good light transmittance, for example, by adding conductive particles to adhesive with a transmittance of over 80% for light with a wavelength above 400 nm or 85% for light with a wavelength above 450 nm. It can also be composed of transparent thin glue containing particles with certain conductivity. Transparent thin glue refers to glue with good transmittance to light, such as glue with a transmittance of over 85% for light a wavelength above 400 nm or glue with a transmittance of over 80% for light a wavelength above 450 nm. The embodiments of the present application do not limit the specific formation method and materials used for the bonding layer 104.

In some embodiments, the operation of forming the bonding layer 104 includes forming the bonding layer 104 on the surface of the bottom cell 103, adhering the surface of the thin film solar cell 102 away from the substrate 101 to the bonding layer 104. Alternatively, the bonding layer 104 is formed on the surface of the thin film solar cell 102 far from the substrate 101, and the bottom cell 103 is attached to the bonding layer 104.

In the process of preparing the bonding layer 104, the two opposite surfaces of the bonding layer 104 need to be attached to the bottom cell 103 and the thin film solar cell 102 respectively. Therefore, the bonding layer 104 can be prepared on the surface of the thin film solar cell 102 far from the substrate 101, and then the bottom cell 103 can be attached to the bonding layer 104. Alternatively, the bonding layer 104 is prepared on the surface of the bottom cell 103, and then the surface of the thin film solar cell 102 away from the substrate 101 can be attached to the bonding layer 104. First, the bonding layer 104 is prepared on the surface of one cell sheet, and the other cell sheet is attached to the bonding layer 104, which reduces the difficulty of preparing the bonding layer 104 and facilitates accurate control of the thickness of the bonding layer 104.

The substrate 101 is removed to expose the surface of the thin film solar cell 102 away from the substrate 101.

In order to ensure the working efficiency of the stacked solar cell, it is also necessary to deposit electrodes and grid lines on the surface of the thin film solar cell 102 far from the bottom cell 103. Therefore, after the thin film solar cell 102 is attached to the bottom cell 103, the substrate 101 attached to the thin film solar cell 102 is removed, and the surface of the thin film solar cell 102 away from the bottom cell 103 is exposed, which facilitates the completion of subsequent processes.

In some embodiments, the operation of removing the substrate 101 includes dissolving substrate 101 with washing solution to remove the substrate 101.

In the operation of removing the substrate 101, methods such as particle blowing and chemical etching can be used. In order to minimize the potential performance damage to the thin film solar cell 102 caused by the operation of removing the substrate 101, a washing solution with good solubility is applied to the molten salt substrate and no or minimal damage to the thin film solar cell 102 can be produced based on the characteristics of the molten salt substrate used as the substrate 101. The good solubility of washing solution for molten salt refers to the fact that for the solute of molten salt substrate 101, washing solution is a good solvent, which can dissolve 10 grams or more of molten salt substrate in 100 grams of washing solution at 20 degrees Celsius.

It should be understood that the washing solution removes the substrate 101 by dissolution, without chemical reaction with the molten salt substrate, nor does it cause impact on the substrate 101 and the thin film solar cell 102. Therefore, compared to chemical etching or particle blowing, the probability of causing damage to the thin film solar cell 102 is lower. In addition, the dissolved molten salt substrate can also be recycled and reused, which reduces the preparation cost of the solar cell.

In some embodiments, the washing solution includes water or methanol. The molten salt substrate used as the substrate 101 is generally soluble in water or methanol, and the cost of using water or methanol as a washing solution is also low, which is also convenient for the subsequent recovery and utilization of molten salt.

Figure 20:
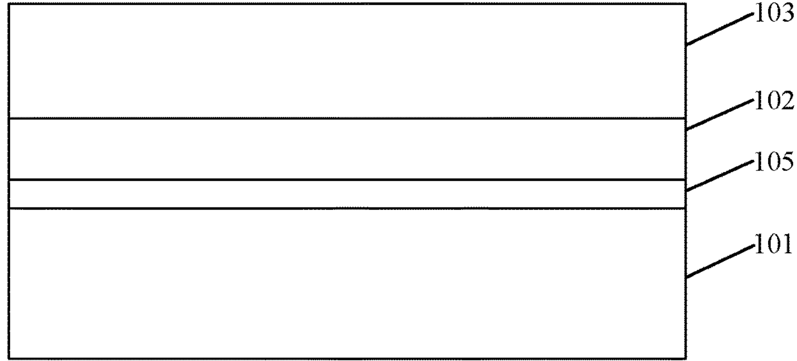
FIG. 20 is a schematic structural view of still another semi-finished solar cell provided according to an embodiment of the present application.

Referring to FIG. 16 to FIG. 20, where FIG. 20 is a schematic structural view of the thin film solar cell 102 prepared on a barrier layer 105. In some embodiments, before forming the thin film solar cell 102, the method further includes forming a barrier layer 105 on the surface of the substrate 101. The operation of forming the thin film solar cell 102 includes forming a thin film solar cell 102 on the surface of the barrier layer 105 away from the substrate 101. After the substrate 101 is removed, the method further includes removing the barrier layer 105.

The formation temperature of the absorption layer 210 of some thin film solar cells 102 is too high. In response to the thin film solar cell 102 being directly prepared on the surface of substrate 101, the side adjacent to the thin film solar cell 102 absorbs too much heat. In response to the temperature rising to a certain extent, the molten salt ions in substrate 101 increase, the concentration of molten salt ions in substrate 101 increases, and the thermal movement of ions is more frequent. In response to the ion concentration being increased and the thermal movement becoming more frequent, the molten salt ions in the substrate 101 are prone to migrate to the thin film solar cell 102, causing damage to the performance and appearance of the thin film solar cell 102.

Therefore, before preparing the thin film solar cell 102, the barrier layer 105 is formed on the surface of the substrate 101, and the thin film solar cell 102 is prepared on the surface of the barrier layer 105 away from the substrate 101. The barrier layer 105 is configured to effectively block the migration of molten salt ions from the substrate 101 to the thin film solar cell 102, which effectively reduces the interference of ion migration during the preparation process of the thin film solar cell 102, and improves the quality of thin film solar cell 102. After the substrate 101 is removed, the barrier layer 105 is removed together to avoid interference with the light absorption capacity of the stacked solar cell and ensure the photoelectric conversion efficiency of the stacked solar cell as much as possible.

In some embodiments, the barrier layer 105 has a thickness of 1 nm to 100 nm.

The thickness of the barrier layer 105 refers to a distance between two surfaces where the barrier layer 105 comes into contact with the thin film solar cell 102 and the substrate 101, respectively. In response to the thickness of the barrier layer 105 being excessive, the operation of removing the barrier layer 105 requires a large amount of time and cost, which is not conducive to efficient mass production. In response to the thickness of the barrier layer 105 being too small, the barrier layer 105 cannot effectively block ion migration in the substrate 101, and the ability to reduce the interference of ion migration in the thin film solar cell 102 is limited, which cannot effectively improve the yield of the thin film solar cell 102.

Therefore, during the production process of the barrier layer 105, the thickness of the barrier layer 105 is set to be ranged from 1 nm to 100 nm, such as 2 nm, 5 nm, 10 nm, 15 nm, 25 nm, 40 nm, 57.5 nm, 70 nm, 85 nm, or 95 nm. By setting the thickness of the barrier layer 105 to an appropriate size, the production and removal time and cost of the barrier layer 105 are effectively controlled, while ensuring that the barrier layer 105 can effectively block the migration of ions from the substrate 101 to the thin film solar cell 102, thereby minimizing damage to the thin film solar cell 102 and ensuring the yield of the thin film solar cell 102.

In some embodiments, the barrier layer 105 includes titanium nitride, aluminum oxide, or molybdenum oxide.

Before preparing the barrier layer 105, at least one of materials such as titanium nitride, aluminum oxide, and molybdenum oxide can be selected for the preparation of the barrier layer 105. The specific material selection can be determined based on the specific type of thin film solar cell 102, and materials that are beneficial or harmless to the thin film solar cell 102 can be selected for the preparation of the barrier layer 105. In addition, according to the specific formation temperature of the absorption layer 210 of the thin film solar cell 102, a material with lower ion migration ability at this temperature can be selected for the preparation of the barrier layer 105 to avoid damage to the thin film solar cell 102 caused by ion migration in the barrier layer 105.

In addition, in the operation of preparing the barrier layer 105, either only one material can be used for the preparation of the barrier layer 105, or a mixture of multiple materials can be used for the preparation of the barrier layer 105, which will not be limited to the embodiments of the present application.

Figure 21:
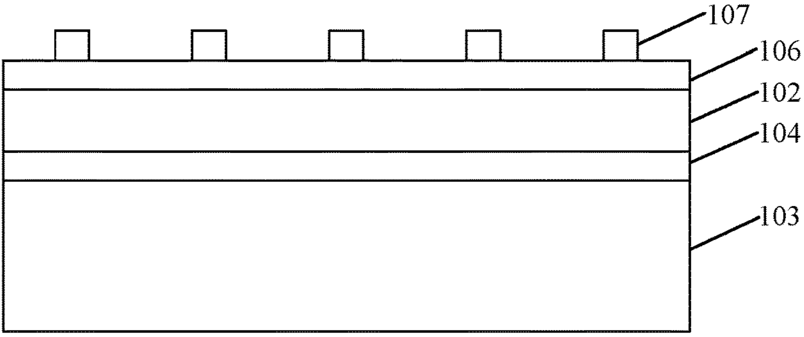
FIG. 21 is a schematic structural view of a solar cell provided according to an embodiment of the present application.

Referring to FIG. 16 to FIG. 21, a transparent electrode layer 106 is formed on the surface of the thin film solar cell 102 away from the bottom cell 103. Among them, FIG. 21 is a schematic structural view of the stacked solar cell when the thin film solar cell 102 is attached to the bottom cell 103 by the bonding layer 104.

After the substrate 101 is removed, the transparent electrode layer 106 is formed on the surface of the thin film solar cell 102 away from the bottom cell 103. Among them, the transparent electrode layer 106 is a thin film that can conduct electricity and has high transmittance in the visible light range. The transparent electrode layer 106 can be a metal film system, oxide film system, other compound film system, polymer film system, or composite film system, etc. The specific types of the transparent electrode layer 106 are not limited in the embodiments of the present application.

Grid lines 107 are formed on the surface of the transparent electrode layer 106 away from the thin film solar cell 102.

Based on the size of the thin film solar cell 102, the number of grid lines 107 that need to be deposited is determined. After the transparent electrode layer 106 is disposed, according to the number of grid lines 107 that need to be deposited, at least two grid lines 107 are formed at certain distance on the surface of the transparent electrode layer 106 away from the thin film solar cell 102.

In summary, in the method for preparing the solar cell solar provided according to the embodiments of the present application, the thin film solar cell 102 is first prepared on a molten salt substrate with a melting point higher than the forming temperature of the absorption layer 210 of the thin film solar cell 102. After that, the bottom cell 103 is provided and attached to the thin film solar cell 102. The molten salt substrate is then removed and a transparent electrode layer 106 is formed on the surface of the thin film solar cell 102. Grid lines 107 are formed on the transparent electrode layer 106 to obtain a stacked solar cell formed by stacking the bottom cell 103 and the thin film solar cell 102. By using a molten salt substrate with a melting point greater than the forming temperature of the absorption layer 210 as the substrate 101 for preparing the thin film solar cell 102, different types of thin film solar cells 102 are ensured to be formed, which improves the adaptability of the method for preparing a stacked solar cell. The molten salt substrate is served as the substrate 101, combined with the characteristics of easy removal of molten salt substrate, which reduces the performance damage caused to the thin film solar cell 102 during the operation of removing the substrate 101, and effectively improves the performance of the stacked solar cell. First, the thin film solar cell 102 is formed on the molten salt substrate, after that, the thin film solar cell 102 is attached to the bottom cell 103, which avoids the performance damage caused by directly preparing the thin film solar cell 102 on the bottom cell 103, thereby ensuring the photoelectric conversion capability of the stacked solar cells, and reducing the difficulty of using the thin film solar cell 102 sensitive to electrode structures to prepare the stacked solar cell.

Correspondingly, referring to FIG. 22, a solar cell is further provided according to another embodiment of the present application, where the solar cell is formed by the method for preparing a solar cell according to any one above, and the solar cell includes the thin film solar cell 102 and the bottom cell 103 arranged in sequence.

Referring to FIG. 23, in some embodiments, the solar cell further includes the bonding layer 104, with two opposite surfaces of the bonding layer 104 attached to the thin film solar cell 102 and the bottom cell 103, respectively. By using bonding layer 104 in preparing the stacked solar cell, damage caused to the thin film solar cell 102 and the bottom cell 103 in preparing the stacked solar cell is reduced.

In some embodiments, the bonding layer 104 is a conductive adhesive. Conductive adhesive can be formed by adding conductive particles to transparent adhesive with good light transmittance, or it can be composed of transparent thin adhesive containing particles with certain conductivity. Transparent thin adhesive refers to adhesive with good light transmittance.

In some embodiments, thin film solar cell 102 includes a CIGS thin film solar cell, a cadmium telluride thin film solar cell, or a III-V family thin film solar cell.

It is not difficult to find that this embodiment is a solar cell structure embodiment corresponding to the embodiment of the method for preparing the solar cell. The details in this embodiment are also applicable in the embodiment of the method for preparing the solar cell, and similarly, the details in the embodiment of the method for preparing the solar cell are also applicable in this embodiment.

Correspondingly, a photovoltaic module is provided according to another embodiment of the present application. The schematic structural view of the photovoltaic module can refer to FIG. 24. The photovoltaic module includes: a cell string, where the cell string is formed by connecting multiple solar cells 910, each of the multiple solar cells is the solar cell according to any one embodiment above. The photovoltaic module further includes a package layer 920 configured to cover a surface of the cell string, and a cover plate 930 configured to cover a surface of the package layer 920 away from the cell string. The solar cell 910 is electrically connected in whole or multiple pieces to form multiple cell strings, which are electrically connected in series and/or parallel.

In some embodiments, the multiple cell strings can be electrically connected by a conductive strip 940. The package layer 920 is configured to cover the front surface and the rear surface of the solar cell 910.

In some embodiments, the package layer 920 can be an organic package film such as ethylene-vinyl acetate copolymer (EVA) film, polyethylene octene co-elastomer (POE) film or polyethylene terephthalate (PET) film.

In some embodiments, the cover plate 930 may be a glass cover plate, a plastic cover plate and other cover plates with light transmission function.

In some embodiments, the surface of the cover plate 930 towards the package layer 920 may be provided with protrusions and recesses, thus increasing the utilization rate of incident light.

Although the present application is disclosed above with preferred embodiments, it is not used to limit the claims. Any person skilled in the art can make some possible changes and modifications without departing from the concept of the present application. The scope of protection shall be subject to the scope defined by the claims of the present application.

Those skilled in the art can understand that the above embodiments are specific embodiments to realize the present application. In practical applications, various changes can be made in form and details without departing from the spirit and scope of the present application. Any person skilled in the art can make their own changes and modifications without departing from the spirit and scope of the present application. Therefore, the scope of protection of the present application shall be subject to the scope defined in the claims.

What is claimed is:

1. A method for forming a monodisperse granular film, comprising:

providing an initial substrate having a first surface;

forming a sacrificial layer, an adhesive layer and a monodisperse granular layer over the first surface, wherein the monodisperse granular layer includes a plurality of granules arranged dispersedly over the first surface, the sacrificial layer is between the plurality of granules and the initial substrate, portions of the adhesive layer are between adjacent granules of the plurality of granules, and the adhesive layer is exposed between adjacent granules on a side of the plurality of granules away from the initial substrate;

removing the initial substrate by dissolving the initial substrate; and removing the sacrificial layer by dissolving the sacrificial layer.

2. The method for forming a monodisperse granular film according to claim 1, wherein the initial substrate includes molten salt or polyvinyl alcohol.

3. The method for forming a monodisperse granular film according to claim 1, wherein forming the sacrificial layer, the adhesive layer and the monodisperse granular layer over the first surface includes:

forming an initial adhesive layer and the monodisperse granular layer over the first surface, wherein first portions of the initial adhesive layer are between the plurality of granules and the initial substrate and second portions of the initial adhesive layer are between adjacent granules of the plurality of granules, and the second portions of the initial adhesive layer are exposed between adjacent granules on the side of the plurality of granules away from the initial substrate; and curing the second portions of the initial adhesive layer to form the adhesive layer.

4. The method for forming a monodisperse granular film according to claim 3, wherein the initial adhesive layer includes negative photoresist, and curing the second portions of the initial adhesive layer to form the adhesive layer includes:

performing exposure processing on a side of the initial adhesive layer away from the initial substrate, wherein the part of the initial adhesive layer between adjacent granules of the plurality of granules is cured to form the adhesive layer by the exposure processing.

5. The method for forming a monodisperse granular film according to claim 1, wherein forming the sacrificial layer, the adhesive layer and the monodisperse granular layer over the first surface includes:

forming the sacrificial layer and the monodisperse granular layer over the first surface, wherein the sacrificial layer is between the plurality of granules and the initial substrate;

forming an initial adhesive layer, wherein first portions of the initial adhesive layer are between the plurality of granules and the initial substrate and second portions of the initial adhesive layer are between adjacent granules of the plurality of granules;

curing the second portions of the initial adhesive layer to form the adhesive layer;

removing the second portions of the initial adhesive layer on the side of the plurality of granules away from the initial substrate by dissolving the second portions of the initial adhesive layer.

6. The method for forming a monodisperse granular film according to claim 5, wherein the initial adhesive layer includes negative photoresist, and curing the second portions of the initial adhesive layer to form the adhesive layer includes:

performing exposure processing on a side of the initial adhesive layer away from the initial substrate, wherein the second portions of the initial adhesive layer is cured to form the adhesive layer by exposure processing.

7. The method for forming a monodisperse granular film according to claim 5, wherein the sacrificial layer includes thermoplastic polymer.

8. The method for forming a monodisperse granular film according to claim 1, wherein before removing the second portions of the initial adhesive layer, the method further includes:

forming a first functional layer between adjacent granules on a side of the plurality of granules away from the initial substrate, and on a surface of the adhesive layer away from the initial substrate.

9. The method for forming a monodisperse granular film according to claim 8, wherein after the first functional layer is formed, the method further includes: forming a substrate over a surface of the first functional layer away from the plurality of granules.

10. The method for forming a monodisperse granular film according to claim 8, wherein the sacrificial layer is removed, and the method further includes: forming a second functional layer between adjacent granules on a side of the plurality of granules away from the first functional layer, and on a surface of the adhesive layer away from the first functional layer.

11. The method for forming a monodisperse granular film according to claim 1, wherein a maximum distance between any two points on an outer surface of each of the plurality of granules ranges from 5 μm to 100 μm.

12. The method for forming a monodisperse granular film according to claim 1, wherein a ratio of an area of an orthographic projection of each of the plurality of granules on the first surface to an area of the first surface ranges from 30% to 90%.

13. The method for forming a monodisperse granular film according to claim 1, wherein the plurality of granules include at least one of semiconductor granules or ion transport granules.

14. The method for forming a monodisperse granular film according to claim 13, wherein the plurality of granules include perovskite granules.

* * * * *